(12) United States Patent
Dougherty

(10) Patent No.: US 9,638,733 B2
(45) Date of Patent: May 2, 2017

(54) COMPUTING DEVICE AND METHODS OF DETECTING THERMAL HOTSPOTS IN A POWER DISTRIBUTION SYSTEM

(71) Applicant: General Electric Company, Schenectady, NY (US)

(72) Inventor: John James Dougherty, Conshohocken, PA (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 675 days.

(21) Appl. No.: 14/106,061

(22) Filed: Dec. 13, 2013

(65) Prior Publication Data

US 2015/0168470 A1 Jun. 18, 2015

(51) Int. Cl.

| | |
|---|---|
| *G01K 1/00* | (2006.01) |
| *G01K 3/00* | (2006.01) |
| *G01K 5/00* | (2006.01) |
| *G01K 7/00* | (2006.01) |
| *G01K 9/00* | (2006.01) |
| *G01K 11/00* | (2006.01) |
| *G01K 13/00* | (2006.01) |
| *G01K 17/00* | (2006.01) |
| *G01R 31/02* | (2006.01) |
| *G01K 7/42* | (2006.01) |

(52) U.S. Cl.
CPC ........... *G01R 31/021* (2013.01); *G01K 3/005* (2013.01); *G01K 7/427* (2013.01)

(58) Field of Classification Search
None
See application file for complete search history.

(56) References Cited

U.S. PATENT DOCUMENTS

| | | | |
|---|---|---|---|
| 4,140,999 | A | 2/1979 | Conway |
| 4,623,265 | A | 11/1986 | Poyser |
| 4,654,806 | A | 3/1987 | Poyser et al. |
| 7,188,997 | B2 | 3/2007 | Tillman et al. |

(Continued)

FOREIGN PATENT DOCUMENTS

| | | |
|---|---|---|
| CN | 2293819 Y | 10/1998 |
| CN | 2569119 Y | 8/2003 |
| CN | 201757682 U | 3/2011 |

OTHER PUBLICATIONS

Khederzadeh ., "Transformer Overload Management and Condition Monitoring",Electrical Insulation, 2008. ISEI 2008. Conference Record of the 2008 IEEE International Symposium , Issue Date: Jun. 9-12, 2008, pp. 116-119, ISSN :1089-084X.

*Primary Examiner* — David M Gray
*Assistant Examiner* — Geoffrey T Evans
(74) *Attorney, Agent, or Firm* — General Electric Company

(57) ABSTRACT

A method of detecting thermal hotspots in a power distribution system is provided. The power distribution system includes a conductive hub including a connection point for coupling to an electrical distribution component. The method includes measuring a first temperature of the conductive hub at the connection point, estimating a second temperature of the conductive hub at the connection point, and determining when a difference between the first temperature and the second temperature exceeds a first predetermined threshold. The estimation based at least partially on an amount of electric current flowing through the conductive hub.

17 Claims, 4 Drawing Sheets

(56) References Cited

U.S. PATENT DOCUMENTS

| | | |
|---|---|---|
| 7,239,977 B2 | 7/2007 | Fantana et al. |
| 2009/0216472 A1 | 8/2009 | Zima et al. |
| 2012/0194344 A1* | 8/2012 | McNamara ............. H02J 13/00 340/584 |

* cited by examiner

COMPUTING DEVICE AND METHODS OF DETECTING THERMAL HOTSPOTS IN A POWER DISTRIBUTION SYSTEM

BACKGROUND

The field of the present disclosure relates generally to electrical power distribution systems and, more specifically, to methods of detecting thermal hotspots in electrical power distribution systems.

The distribution of electrical power is typically managed using distribution enclosures, such as load centers, panelboards, and switchgear, for example. The distribution enclosures provide electricity to a load, such as machines and motors. Switchgear, for example, typically include one or more electrical busbars that enable current to flow to the load. More specifically, at least some known electrical busbars are relatively heavy conductive strips that conduct electricity within the switchgear, distribution station, or other electrical system or apparatus.

At least some known electrical busbars are susceptible to thermal hotspots that will undesirably adversely affect the performance and/or integrity of the busbar. Generally, thermal hotspots are caused by variations in resistance at connections points between the electrical busbar and other power distribution components. For example, variations in resistance are caused by loosened couplings, oxidation, thermal expansion and/or contraction, and/or overloading at the connection points. At least some known distribution enclosures include systems that monitor the temperature of components in the distribution enclosures, and that provide an alert upon detection of a potential thermal hotspot therein. These systems generally detect thermal hotspots by measuring a temperature of the busbar at the connection point, and determining whether the measured temperature exceeds a predetermined threshold. However, only measuring the temperature of the busbar may provide false detection of thermal hotspots. For example, unexpectedly high temperatures may be measured as a result of certain operational factors such as blockage of airflow through the distribution enclosure and/or operating the busbar near the limit of the breaker.

BRIEF DESCRIPTION

In one aspect, a method of detecting thermal hotspots in a power distribution system is provided. The power distribution system includes a conductive hub including a connection point for coupling to an electrical distribution component. The method includes measuring a first temperature of the conductive hub at the connection point, estimating a second temperature of the conductive hub at the connection point, and determining when a difference between the first temperature and the second temperature exceeds a first predetermined threshold. The estimation is based at least partially on an amount of electric current flowing through the conductive hub.

In another aspect, a computing device for detecting thermal hotspots in a power distribution system is provided. The computing device includes a processor and a memory coupled to the processor. The memory contains processor-executable instructions that, when executed by the processor, cause the computing device to perform the steps of receiving a first temperature of a connection point of a conductive hub, receiving a measurement of an amount of electric current flowing through the conductive hub, estimating a second temperature of the conductive hub at the connection point, and determining when a difference between the first temperature and the second temperature exceeds a first predetermined threshold. The estimation is based at least partially on an amount of electric current flowing through the conductive hub.

In yet another aspect, a computer-implemented method of detecting thermal hotspots in a power distribution system is provided. The power distribution system includes a conductive hub including a connection point for coupling to an electrical distribution component. The method includes receiving a first temperature of a connection point of a conductive hub, receiving a measurement of an amount of electric current flowing through the conductive hub, estimating a second temperature of the conductive hub at the connection point, and determining when a difference between the first temperature and the second temperature exceeds a first predetermined threshold. The estimation is based at least partially on an amount of electric current flowing through the conductive hub.

DETAILED DESCRIPTION

Embodiments of the present disclosure relate to detection of thermal hotspots in a power distribution system. More specifically, in the exemplary embodiment, thermal hotspots are detected by measuring a temperature of a conductive hub at a connection point defined therein, estimating the temperature of the conductive hub, and determining when a difference between the measured and estimated temperatures exceed a predetermined threshold. The estimated temperature is calculated using the following formula:

$$T_{busbar} = T_{ambient} + K \cdot I^2_{busbar} - \text{Convection}(f(T_{busbar} - T_{ambient})^{1.25}) - \text{Radiation}(f(T^4_{busbar} - T^4_{ambient})),$$

where T is temperature, K is an aggregate factor that includes busbar resistivity and skin effect, I is current, and Convection and Radiation calculations account for heat loss in the busbar. As such, the estimated temperature is based at least partially on an amount of current flowing through the conductive hub, and an ambient temperature surrounding the conductive hub. The estimated temperature is then used as a model estimate to be compared to the measured temperature of the conductive hub. More specifically, if a joint at the connection point deteriorates, the measured temperature will deviate from the model estimate. If the deviation exceeds the predetermined threshold, a thermal hotspot alert will be provided. By using both the estimated temperature and the measured temperature to detect thermal hotspots, the methods and systems described herein facilitate providing earlier and more accurate detection of thermal hotspots when compared to detection techniques based on measured temperatures alone.

Figure 1:
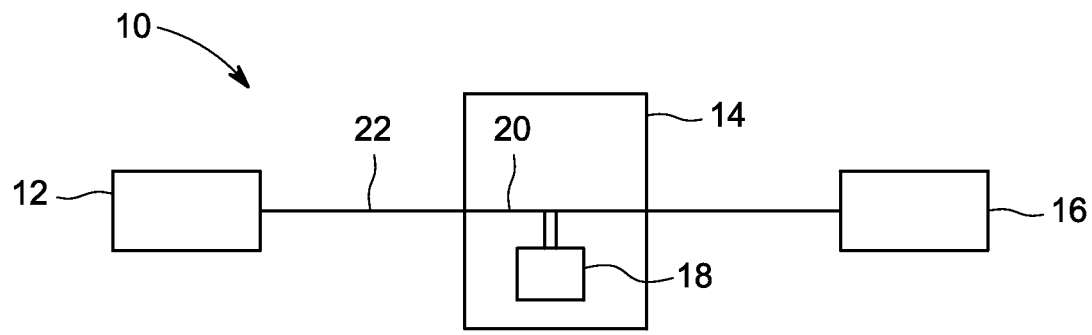
FIG. 1 is a schematic view of an exemplary power distribution system.

FIG. 1 is a schematic view of an exemplary power distribution system 10. In the exemplary embodiment, power distribution system 10 includes an electrical power source 12, a distribution enclosure 14, such as a switchgear, to distribute electric power to a load 16, a circuit protection device 18, and one or more conductive hubs 20 such as, for example, a busbar.

Load 16 may include, for example, machinery, motors, lighting, and/or other electrical and mechanical equipment of a manufacturing or power generation or distribution facility. Distribution enclosure 14 may be, for example, a switchgear unit. Power is provided to distribution enclosure 14 through an electrical distribution line 22, which is coupled to one or more conductive hubs 20 within distribution enclosure 14. Conductive hubs 20 are also coupled to circuit protection device 18 such that circuit protection device 18 may selectively enable or disable current from flowing through conductive hubs 20 and electrical distribution line 22 to one or more loads 16. Conductive hubs 20 are manufactured from any electrically conductive material that enables current to flow therethrough. Exemplary materials include, but are not limited to, copper.

Figure 2:
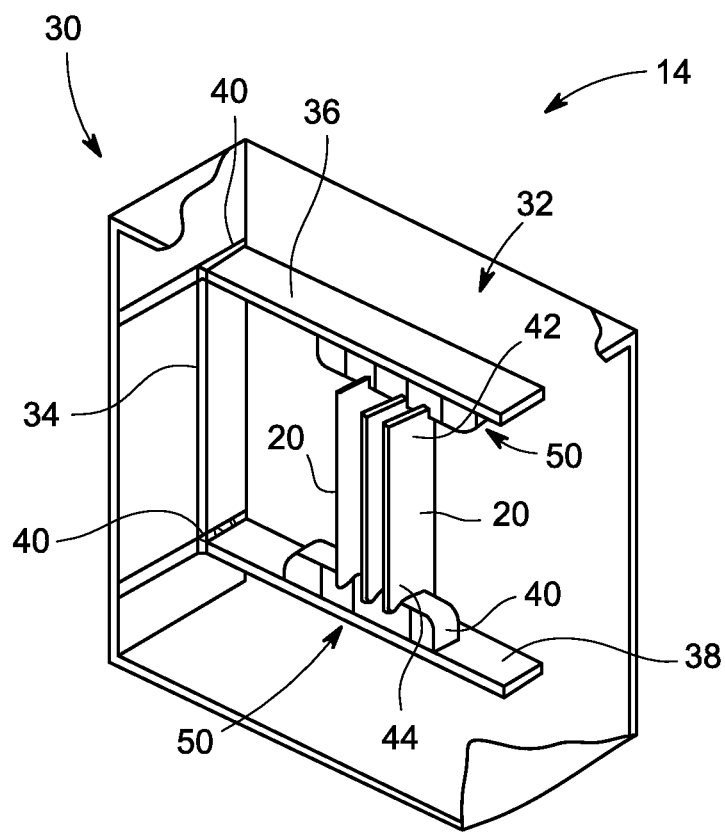
FIG. 2 is a perspective cutaway view of an exemplary distribution enclosure that may be used in the power distribution system shown in FIG. 1.

FIG. 2 is a perspective cutaway view of distribution enclosure 14. In the exemplary embodiments, distribution enclosure 14 includes a housing 30 and an electrical conductor support system 32 to support one or more conductive hubs 20. Housing 30 includes a support framework 34 for protecting and/or supporting components of distribution enclosure 14. Housing 30 and/or support framework 34 is manufactured from metal and/or a metal alloy, such as steel. Alternatively, housing 30 and/or support framework 34 is manufactured from any material that enables housing 30 to function as described herein.

In the exemplary embodiment, conductive hubs 20 carry and distribute the primary current of power distribution system 10. FIG. 2 depicts power distribution system 10 having three conductive hubs 20, which form one phase of a three-phase electrical distribution circuit (not shown). However, any number of conductive hubs 20 and/or phases may be used that enable power distribution system 10 to function as described herein. Moreover, conductive hubs 20 may be arranged in any orientation that enables power distribution system 10 to function as described herein. In the exemplary embodiment, conductive hubs 20 are arranged vertically. Moreover, the number and/or geometry of conductive hubs 20 may be selected based on a desired amount of current capacity for the conductive hub phase.

In the exemplary embodiment, conductive hubs 20 are held in fixed relation with each other via conductor support system 32. Generally, conductor support system 32 includes first and second supporting members or rails 36 and 38, and modular insulators 50. First and second support rails 36 and 38 are coupled to housing 30 and/or support framework 34 using suitable hardware 40. Insulators 50 are also coupled to first and second support rails 36 and 38 using suitable hardware 40. As used herein, "suitable hardware" refers to any combination of nuts, bolts, washers, screws, self-tapping screws, welds, or any other suitable fastening mechanism for the respective parts for the purposes disclosed herein. In the exemplary embodiment, each conductive hub 20 includes a first end 42 and a second end 44. Each first end 42 is engaged and supported by insulator 50 coupled to first support rail 36, and each corresponding second end 44 is engaged and supported by insulator 50 coupled to second rail 38. Thus, conductor support system 32 separates and supports each conductive hub 20.

Figure 3:
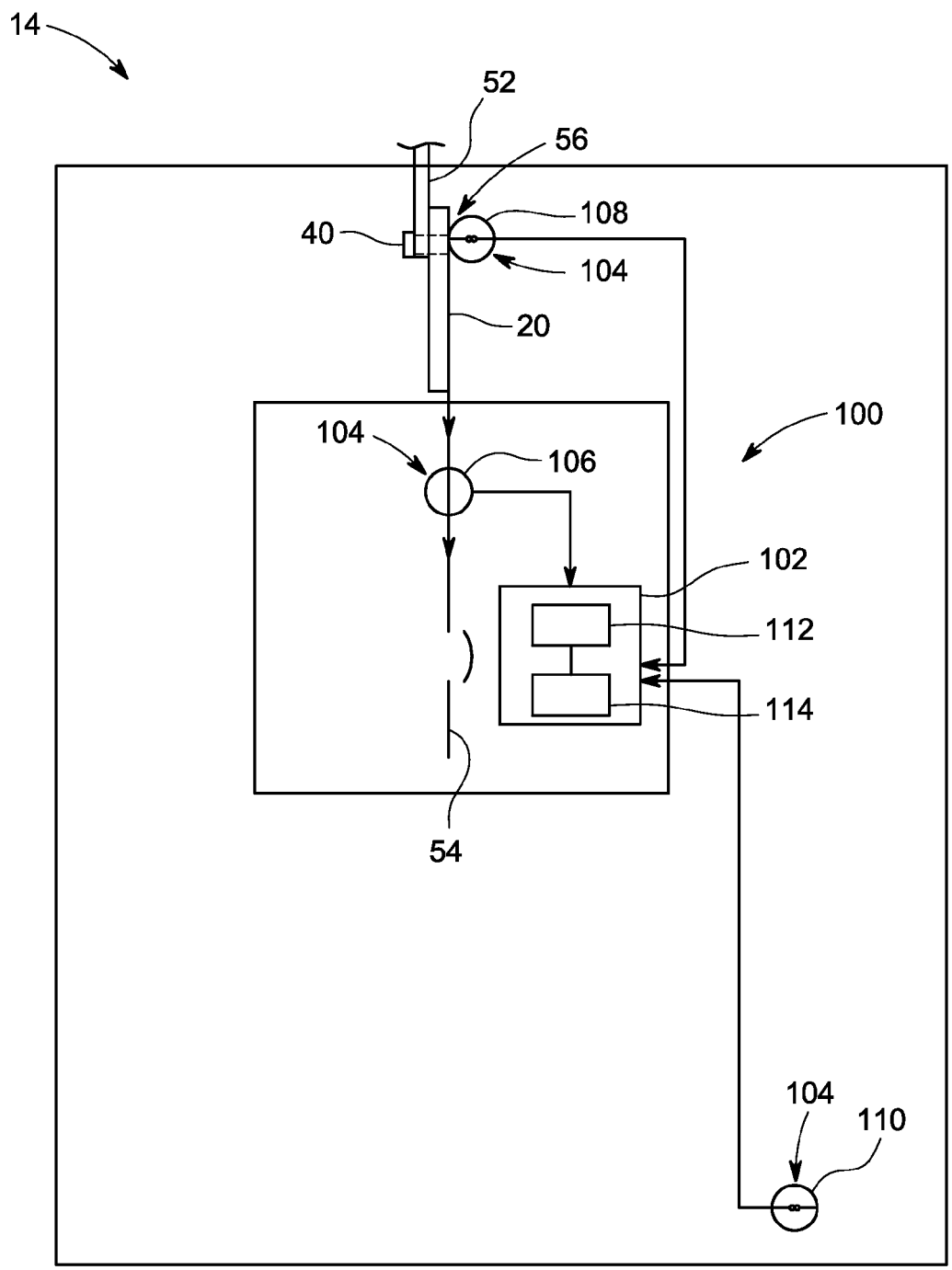
FIG. 3 is a schematic diagram of the distribution enclosure shown in FIG. 2.

FIG. 3 is a schematic diagram of distribution enclosure 14. In the exemplary embodiment, distribution enclosure 14 includes conductive hub 20, an electrical distribution component 52, and a circuit breaker 54 positioned therein. As used herein, "electrical distribution component" refers to any component typically found in a distribution enclosure and capable of carrying current therethrough. Conductive hub 20 is coupled to electrical distribution component 52 at a connection point 56 via suitable hardware 40. A thermal hotspot detection device 100 is also positioned within distribution enclosure 14 and configured to detect thermal hotspots at conductive hub 20.

In the exemplary embodiment, thermal hotspot detection device 100 includes a computing device 102 and a plurality of measurement devices 104 coupled in communication with computing device 102. Measurement devices 104 include a current transformer 106, a first temperature sensor 108, and a second temperature sensor 110. Current transformer 106 is coupled in communication with conductive hub 20, first temperature sensor 108 is coupled to conductive hub 20 at connection point 56, and second temperature sensor 110 is positioned remotely from conductive hub 20. Measurement devices 104 provide measured values to computing device 102 to enable detection of thermal hotspots at connection point 56 of conductive hub 20. More specifically, current transformer 106 measures an amount of current flowing through conductive hub 20, first temperature sensor 108 measures a temperature of conductive hub 20 at connection point 56, and second temperature sensor 110 measures an ambient temperature within distribution enclosure 14. Second temperature sensor 110 is positioned remotely from conductive hub 20 to facilitate reducing inaccurate temperature measurements caused by heat dissipation from conductive hub 20. In an alternative embodiment, measurement devices 104 are coupled to computing device 102 via wireless communication.

Computing device 102 includes a memory 112 and a processor 114 coupled to memory 112 for executing programmed instructions. Processor 114 may include one or more processing units (e.g., in a multi-core configuration) and/or include a cryptographic accelerator (not shown). Computing device 102 is programmable to perform one or more operations described herein by programming memory 112 and/or processor 114. For example, processor 114 may be programmed by encoding an operation as executable instructions and providing the executable instructions in memory 112.

Processor 114 may include, but is not limited to, a general purpose central processing unit (CPU), a microcontroller, a reduced instruction set computer (RISC) processor, an open media application platform (OMAP), an application specific integrated circuit (ASIC), a programmable logic circuit (PLC), and/or any other circuit or processor capable of executing the functions described herein. The methods described herein may be encoded as executable instructions embodied in a computer-readable medium including, without limitation, a storage device and/or a memory device. Such instructions, when executed by processor 114, cause processor 114 to perform at least a portion of the functions described herein. The above examples are exemplary only, and thus are not intended to limit in any way the definition and/or meaning of the term processor.

Memory 112 is one or more devices that enable information such as executable instructions and/or other data to be stored and retrieved. Memory 112 may include one or more computer-readable media, such as, without limitation, dynamic random access memory (DRAM), synchronous dynamic random access memory (SDRAM), static random access memory (SRAM), a solid state disk, and/or a hard disk. Memory 112 may be configured to store, without limitation, executable instructions, operating systems, applications, resources, installation scripts and/or any other type of data suitable for use with the methods and systems described herein.

Instructions for operating systems and applications are located in a functional form on non-transitory memory 112 for execution by processor 114 to perform one or more of the processes described herein. These instructions in the different implementations may be embodied on different physical or tangible computer-readable media, such as memory 112 or another memory, such as a computer-readable media (not shown), which may include, without limitation, a flash drive and/or thumb drive. Further, instructions may be located in a functional form on non-transitory computer-readable media, which may include, without limitation, smart-media (SM) memory, compact flash (CF) memory, secure digital (SD) memory, memory stick (MS) memory, multimedia card (MMC) memory, embedded-multimedia card (e-MMC), and micro-drive memory. The computer-readable media may be selectively insertable and/or removable from computing device 102 to permit access and/or execution by processor 114. In an alternative implementation, the computer-readable media is not removable.

Figure 4:
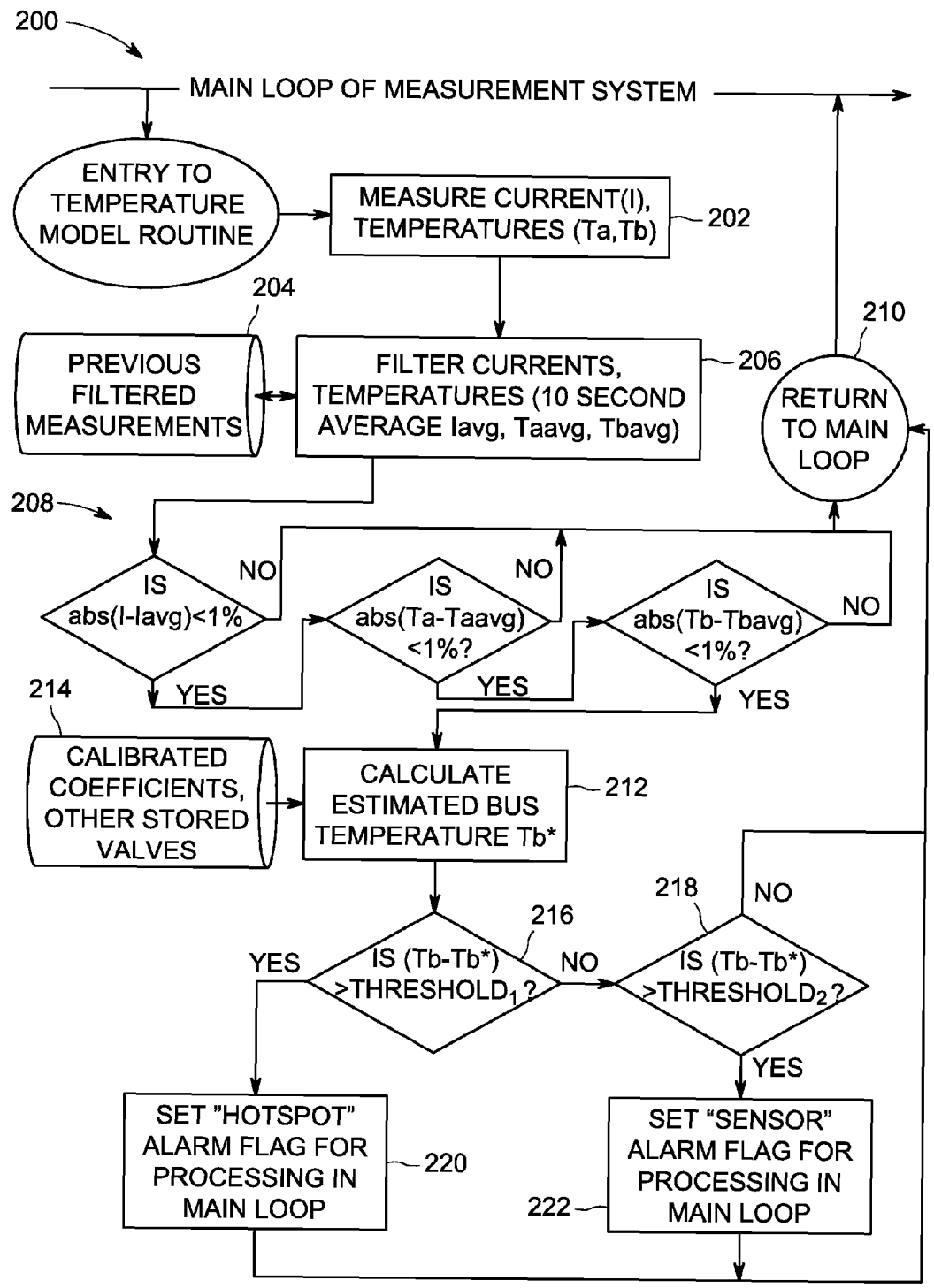
FIG. 4 is a flow diagram illustrating an exemplary measurement routine for use in detecting thermal hotspots in the power distribution system shown in FIG. 1.

FIG. 4 is a flow diagram illustrating an exemplary measurement routine 200 for use in detecting thermal hotspots in power distribution system 10. More specifically, measurement routine 200 is executed by thermal hotspot detection device 100 to detect thermal hotspots at connection point 56 of conductive hub 20 (each shown in FIG. 3). In the exemplary embodiment, computing device 102 of thermal hotspot detection device 100 (each shown in FIG. 3) is configured to measure 202 and store values for at least one parameter in a first database 204. Exemplary parameters include at least one of an amount of current flowing through conductive hub 20, a measured temperature of conductive hub 20 measured by first temperature sensor 108 (shown in FIG. 3), and an ambient temperature measurement of an area surrounding conductive hub 20 measured by second temperature sensor 110 (shown in FIG. 3). The values are measured over any interval that enables measurement routine 200 to function as described herein. In the exemplary embodiment, the values are measured at a rate between about once per 100 milliseconds and about once per second.

The measured values are then stored in database 204 and filtered 206 before being used to determine the estimated temperature of conductive hub 20. More specifically, filtering 206 the measured values includes measuring the values for at least one parameter over a predetermined time period, calculating a representative value for each parameter taken, and determining 208 a stable operating point of measurement routine 200. Exemplary representative values include, but are not limited to, an average, and a median. More specifically, the stable operating point is determined 208 when a difference between the representative value for each parameter and a most recent measured value for each parameter is within a predetermined tolerance. If the difference is defined within the predetermined tolerance, the most recent of the measured values are then used to estimate the temperature of conductive hub 20. If any of the measurements of the difference between the most recent and representative values is not defined within the predetermined tolerance, computing device 102 exits measurement routine 200 and returns 210 to the main loop of measurement routine 200. As such, determining 208 facilitates evaluating the stability of the measured values to ensure accurate temperature estimations are calculated using the most recent measured values. Alternatively, the measured values are filtered 206 with a longer term exponential averaging filter to create a long term average.

The predetermined time period is any time period that enables measurement routine 200 to function as described herein. In the exemplary embodiment, the representative values are calculated over a predetermined time period of about 10 seconds. More specifically, the representative values are calculated over a moving time period. As such, the representative values that are calculated over the most recent intervals are compared to the most recent of each measured value. Moreover, the predetermined tolerance is any tolerance that enables measurement routine 200 to function as described herein. In the exemplary embodiment, the predetermined tolerance is about 1 percent.

As described above, if the difference between the representative values and the most recent of each measured value is defined within the predetermined tolerance, the most recent measured values are then used to estimate 212 the temperature of conductive hub 20. The estimated temperature is calculated using the formula described above. In the exemplary embodiment, model coefficient and other input data are stored in a second database 214 and used to calibrate the estimated temperature of conductive hub 20. More specifically, the model coefficients are calculated as will be described below, and the other input data are based on a physical property associated with conductive hub 20 such as, but not limited to, a geometry, a material, and a manufacturer of conductive hub 20. Alternatively, a factory procedure that applies low voltage and higher current through connection point 56 using recommended attachments can provide advanced calibration under known conditions.

After the temperature of conductive hub 20 has been estimated 212, the estimated temperature is compared 216 to the measured temperature of conductive hub 20. More specifically, the estimated temperature is compared 216 and 218 to the measured temperature to determine when a difference between the two exceeds one of the two predetermined thresholds. For example, sensor misoperation (i.e, an open circuit) is indicated if the measured temperature is below the model estimate, and a poor connection at connection point 56 is indicated if the measured temperature is above the model estimate. When the measured temperature is above the model estimate and if the difference exceeds a first predetermined threshold, a thermal hotspot alarm is provided 220. Alternatively, the thermal hotspot alarm is provided 220 when the measured temperature exceeds a manually set maximum predetermined temperature threshold. If the difference exceeds a second predetermined threshold that is greater than the first predetermined threshold, a sensor failure alarm is provided 222.

The predetermined thresholds may have any value that enables measurement routine 200 to function as described herein. In the exemplary embodiment, the first predetermined threshold is defined at about ±20 percent when measurement routine 200 is first initialized. As the estimated temperature is calculated over a moving time period, a third predetermined threshold for the difference between the estimated temperature and the measured temperature is defined. More specifically, as measured values are continuously filtered 206 during operation of thermal hotspot detection device 100, and as estimation errors between the estimated temperature and the measured temperature are continuously determined, the first predetermined threshold is reduced to the third predetermined threshold to facilitate tracking the thermal hotspot alarm 220 more closely to the estimation error. For example, the first predetermined threshold is reduced when the estimation error is within a predetermined tolerance. If the estimation error has a first value, the predetermined tolerance may be a multiple of the first value. Alternatively, the first predetermined threshold is based at least partially on a number of estimation errors continuously determined by thermal hotspot detection device 100. More specifically, the first predetermined threshold will initially be defined at a first tolerance, and the threshold will be reduced as the number of estimation recordings increases, and the estimation improves. Alternatively, the contracted predetermined threshold may be defined manually such that the first predetermined threshold does not get dynamically reduced in the system below the set threshold.

Figure 5:
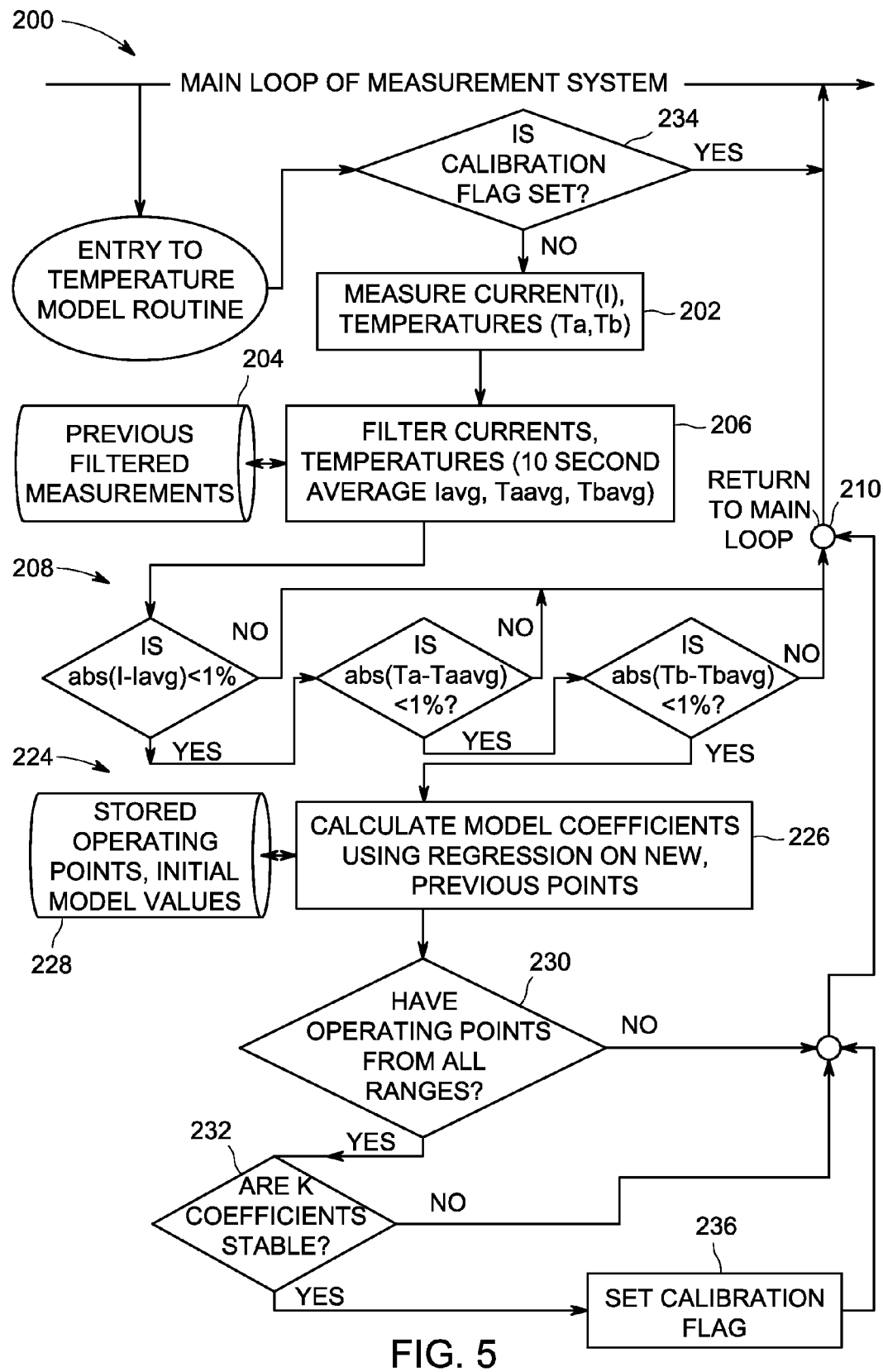
FIG. 5 is a flow diagram illustrating an exemplary method of calibrating the measurement routine shown in FIG. 4.

FIG. 5 is a flow diagram illustrating an exemplary method 224 of calibrating measurement routine 200. Because a poor joint at connection point 56 (shown in FIG. 3) can initially perform adequately, method 224 is implemented to ensure a slowly deteriorating joint at connection point 56 does not continuously recalibrate measurement routine 200 and such that the gradual loss of joint integrity does not adversely affect the estimated temperature of conductive hub 20 (shown in FIG. 3).

As described above, a stable operating point is determined 208 if the difference between the representative values and the most recent of each measured value is defined within a predetermined tolerance. In the exemplary embodiment, after the stable operating point has been determined 208, measurement routine 200 calculates 226 model coefficients to be stored in database 214 (shown in FIG. 4) and used to calibrate the estimated temperature calculation 212 (shown in FIG. 4) for conductive hub 20. More specifically, measurement routine 200 runs a multiple regression routine to determine the model coefficients. In some embodiments, the non-linear aspect of the underlying system may result in other similar models using the natural log of current, the cube of current, or other powers of current in the regression. Alternatively, any suitable curve fitting method may be used that enables measurement routine 200 to function as described herein. In the exemplary embodiment, previous operating points and initial model coefficient values are stored 228 and used to calculate 226 the model coefficients. Measurement routine 200 then determines 230 whether a predetermined range of operating points have occurred and been included in the regression routine, and determines 232 whether the model coefficients are defined within a predetermined tolerance. If so, calibration flag is set 234 such that further regression routines are not executed 234.

In some embodiments, method 224 is restarted after the calibration flag has been set 236 after occurrence of an event. An exemplary event includes, but is not limited to, the performance of routine maintenance within distribution enclosure 14. More specifically, the performance of routine maintenance will typically change the operating conditions at connection point 56. As such, the calibration flag is reset to a default position, and measurement routine 200 calculates 226 model coefficients for the new operating conditions.

The systems and methods described herein facilitate detecting thermal hotspots in a power distribution system. In the exemplary embodiment, a measurement routine is implemented that determines when a difference between an estimated temperature of a conductive hub in the power distribution system and a measured temperature of the conductive hub exceeds a predetermined threshold. By using both estimated temperatures and measured temperatures of the conductive hub to detect thermal hotspots, false detection of thermal hotspots is substantially reduced. As such, the systems and methods described herein provide more accurate detection of thermal hotspots than detection techniques based on measured temperatures alone.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of detecting thermal hotspots in a power distribution system, wherein the power distribution system includes a conductive hub including a connection point for coupling to an electrical distribution component, said method comprising:
   measuring a first temperature of the conductive hub at the connection point;
   measuring values for at least one parameter over a predetermined time period, wherein the at least one parameter includes at least one of the amount of current flowing through the conductive hub, a temperature measurement of the conductive hub, and an ambient temperature measurement of an area surrounding the conductive hub;
   calculating a representative value for each parameter;
   determining a stable operating point when a difference between the representative value for each parameter and the measured value for each parameter is within a first predetermined tolerance;
   estimating a second temperature of the conductive hub at the connection point, the estimation based at least partially on an amount of electric current flowing through the conductive hub; and
   determining when a difference between the first temperature and the second temperature exceeds a first predetermined threshold.

2. The method in accordance with claim 1, wherein estimating a second temperature of the conductive hub comprises estimating the second temperature of the conductive hub at the connection point based at least partially on an ambient temperature measurement surrounding the conductive hub.

3. The method in accordance with claim 1, wherein estimating a second temperature of the conductive hub comprises calculating the second temperature using the measured value when the stable operating point is reached.

4. The method in accordance with claim 1, wherein calculating a representative value comprises calculating the representative value over a moving time period.

5. The method in accordance with claim 1 further comprising defining a second predetermined threshold for the difference between the second temperature and the first temperature as the second temperature is calculated over a moving time period.

6. The method in accordance with claim 5, wherein defining a second predetermined threshold comprises:
   determining an error between the first temperature and the second temperature; and reducing the first predetermined threshold to the second predetermined threshold when the error is within a second predetermined tolerance.

7. The method in accordance with claim 1, wherein estimating a second temperature of the conductive hub comprises calibrating the second temperature as a function of a physical property associated with the conductive hub.

8. A computing device for detecting thermal hotspots in a power distribution system, the computing device comprising:
 a processor;
 a memory coupled to said processor, said memory containing processor-executable instructions that, when executed by said processor, cause the computing device to perform the steps of:
 receiving a first temperature of a connection point of a conductive hub;
 receiving a measurement of an amount of electric current flowing through the conductive hub;
 receiving values for at least one parameter over a predetermined time period, wherein the at least one parameter includes at least one of the measurement of the amount of current flowing through the conductive hub, a temperature measurement of the conductive hub, and an ambient temperature measurement of an area surrounding the conductive hub;
 calculating a representative value for each parameter;
 determining a stable operating point when a difference between the representative value for each parameter and the measured value for each parameter is within a first predetermined tolerance;
 estimating a second temperature of the conductive hub at the connection point, the estimation based at least partially on the measurement of the amount of current flowing through the conductive hub;
 determining when a difference between the first temperature and the second temperature exceeds a first predetermined threshold; and
 providing an alert when the difference between the first temperature and the second temperature exceeds the first predetermined threshold.

9. The device in accordance with claim 8, wherein the processor-executable instructions further cause said computing device to perform the step of receiving an ambient temperature measurement from an ambient temperature sensor.

10. The device in accordance with claim 9, wherein the processor-executable instructions further cause said computing device to perform the step of estimating the second temperature of the conductive hub at the connection point based at least partially on the ambient temperature measurement.

11. The device in accordance with claim 8, wherein the processor-executable instructions further cause said computing device to perform the step of defining a second predetermined threshold as the second temperature is calculated over a moving time period.

12. A computer-implemented method of detecting thermal hotspots in a power distribution system, wherein the power distribution system includes a conductive hub including a connection point for coupling to an electrical distribution component, said method comprising:
 receiving a first temperature of the connection point of the conductive hub;
 receiving a measurement of an amount of electric current flowing through the conductive hub;
 receiving values for at least one parameter over a predetermined time period, wherein the at least one parameter includes at least one of the measurement of the amount of current flowing through the conductive hub, a temperature measurement of the conductive hub, and an ambient temperature measurement of an area surrounding the conductive hub;
 comparing the representative value for each parameter to a measured value for each parameter;
 determining a stable operating point when a difference between the representative value for each parameter and the measured value for each parameter is within a first predetermined tolerance;
 estimating a second temperature of the conductive hub at the connection point, the estimation based at least partially on the measurement of the amount of current flowing through the conductive hub; and
 determining when a difference between the first temperature and the second temperature exceeds a first predetermined threshold.

13. The computer-implemented method in accordance with claim 12 further comprising:
 receiving an ambient temperature measurement of an area surrounding the conductive hub; and
 estimating the second temperature of the conductive hub based at least partially on the ambient temperature measurement.

14. The computer-implemented method in accordance with claim 12, wherein estimating a second temperature of the conductive hub comprises calculating the second temperature using the measured value when the stable operating point is reached.

15. The computer-implemented method in accordance with claim 12 further comprising defining a second predetermined threshold for the difference between the first temperature and the second temperature as the second temperature is calculated over a moving time period.

16. The computer-implemented method in accordance with claim 15, wherein defining a second predetermined threshold comprises:
 determining an error between the first temperature and the second temperature; and
 reducing the first predetermined threshold to the second predetermined threshold when the error is within a second predetermined tolerance.

17. The computer-implemented method in accordance with claim 12, wherein estimating a second temperature of the conductive hub comprises calibrating the second temperature as a function of a physical property associated with the conductive hub.

* * * * *